United States Patent
Li et al.

(10) Patent No.: US 7,593,239 B2
(45) Date of Patent: Sep. 22, 2009

(54) FIXING DEVICE FOR SECURING CIRCUIT BOARD TO PLATE MEMBER

(75) Inventors: Tsung-Hsi Li, Taipei Hsien (TW); Ming-Chih Hsieh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 31 days.

(21) Appl. No.: 11/923,667

(22) Filed: Oct. 25, 2007

(65) Prior Publication Data

US 2008/0212293 A1   Sep. 4, 2008

(30) Foreign Application Priority Data

Mar. 1, 2007   (CN) .................... 2007 1 0200244

(51) Int. Cl.
*H05K 7/02*   (2006.01)
*H05K 7/04*   (2006.01)

(52) U.S. Cl. .................... 361/807; 361/803; 361/804

(58) Field of Classification Search ............. 361/807, 361/810, 742, 758, 770, 804; 174/138 G; 439/76.1

See application file for complete search history.

(56) References Cited

U.S. PATENT DOCUMENTS

| | | | |
|---|---|---|---|
| 4,842,437 A * | 6/1989 | Egner | 403/24 |
| 6,347,042 B1 * | 2/2002 | White | 361/784 |
| 6,377,445 B1 * | 4/2002 | Davis et al. | 361/683 |
| 6,535,394 B1 | 3/2003 | Hirzmann | |
| 7,052,291 B2 * | 5/2006 | Barina et al. | 439/92 |

FOREIGN PATENT DOCUMENTS

EP   0840021 A1   5/1998

* cited by examiner

*Primary Examiner*—Hung S Bui
(74) *Attorney, Agent, or Firm*—Frank R. Niranjan

(57) ABSTRACT

A fixing device for securing a circuit board to a plate member includes a spacer, a nut member, and a fastener. A coupling hole is defined through the spacer. A female thread is formed on a part of an interior surface of the coupling hole at an end thereof. A nut member comprises a pressing portion and a coupling portion extending from the pressing portion. A male thread is formed on a part of an exterior surface of the coupling portion at a free end thereof, corresponding to the female thread of the coupling hole of the spacer such that the coupling portion is capable of being movably retained in the coupling hole. A threaded hole is defined in the nut member. A fastener includes a head and a threaded rod extending from the head for being screwed in the threaded hole of the nut member.

14 Claims, 3 Drawing Sheets

FIXING DEVICE FOR SECURING CIRCUIT BOARD TO PLATE MEMBER

BACKGROUND

1. Field of the Invention

The present invention relates to fixing devices, and more particularly to a fixing device for securing a circuit board to a plate member.

2. Description of Related Art

In assembly of computer systems, it is important to firmly secure a motherboard to a computer chassis so that vibrations caused, for instance, by the computer's ventilation fans or shocks to the computer do not cause expansion boards or memory modules to come loose or other components to be loosened or their connections to be damaged. Generally, a plurality of supporting posts each with a threaded hole defined therein, protrudes from the computer chassis corresponding to a plurality of standard holes in the motherboard. During installation, a plurality of screws is inserted through the standard holes of the motherboard and screwed into the corresponding threaded holes of the supporting posts, thereby the motherboard being secured to the computer chassis and supported by the supporting posts. However, machining of the supporting posts and drilling of the threaded holes is only done within a certain tolerance, which is not precise enough to ensure accurate alignment of parts.

What is desired, therefore, is a fixing device for adjustably and reliably securing a circuit board to a plate member.

SUMMARY

An exemplary fixing device for securing a circuit board to a plate member comprises a spacer, a nut member, and a fastener. The spacer is adapted to be located between the circuit board and the plate member. A coupling hole is defined through the spacer. A female thread is formed on a part of the interior surface of the coupling hole at an end thereof. A nut member comprises a pressing portion and a coupling portion extending from the pressing portion. A male thread is formed on a part of the exterior surface of the coupling portion at a free end thereof, corresponding to the female thread of the coupling hole of the spacer. A threaded hole is defined in the nut member. The coupling portion is capable of being inserted through the plate member and movably retained in the coupling hole of the spacer after the free end of the coupling portion with the male thread is screwed through the end of the coupling hole with the female thread. The pressing portion and the spacer are cooperatively configured for sandwiching the plate member therebetween. A fastener includes a head and a threaded rod extending from the head for being inserted through the circuit board and screwed in the threaded hole of the nut member. The head is adapted to sandwich the circuit board with the spacer.

Other advantages and novel features of the present invention will become more apparent from the following detailed description of preferred embodiment when taken in conjunction with the accompanying drawings, in which:

DETAILED DESCRIPTION

Figure 1:
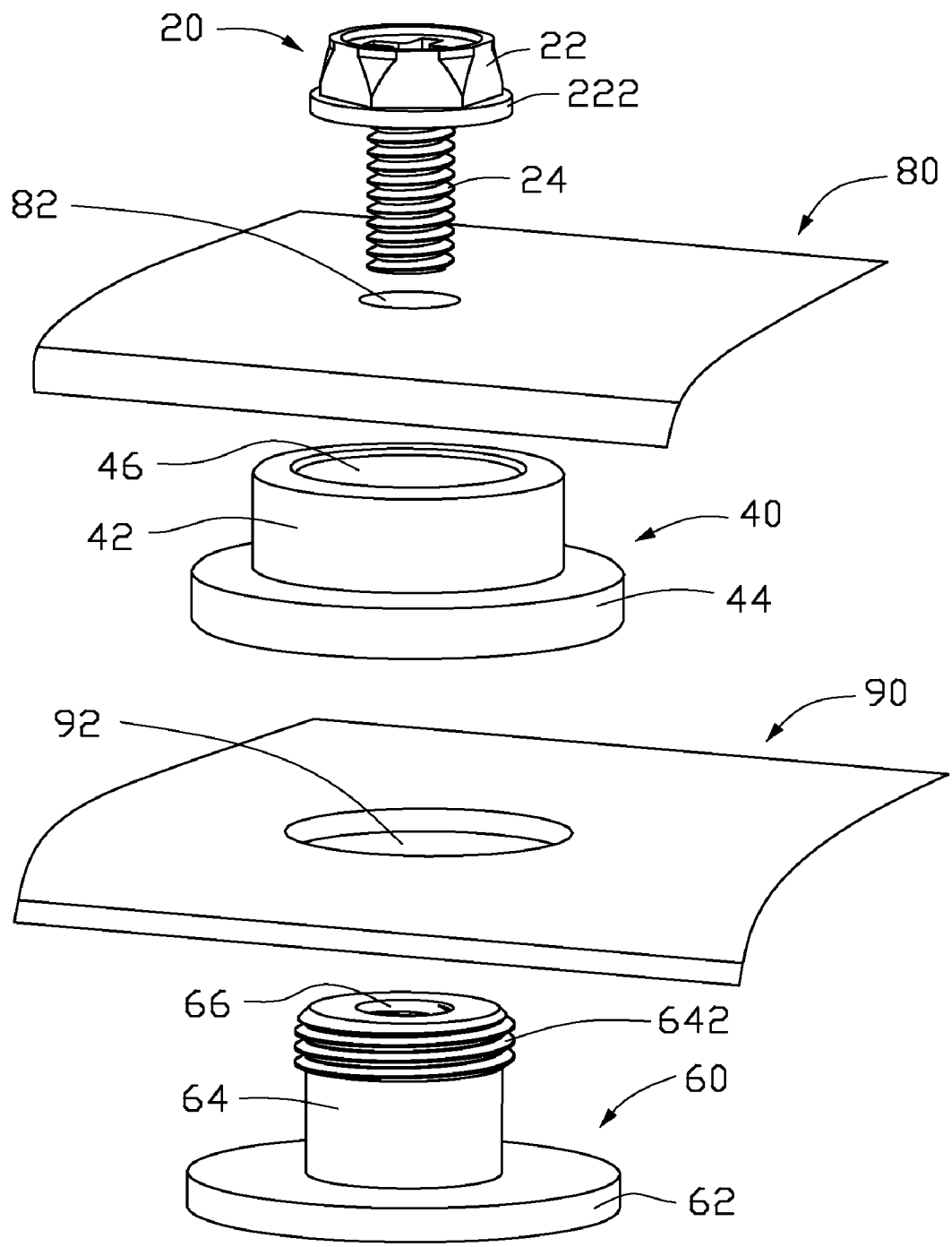
FIG. 1 is an exploded, isometric view of a fixing device in accordance with an embodiment, together with a circuit board and a plate member.
Figure 2:
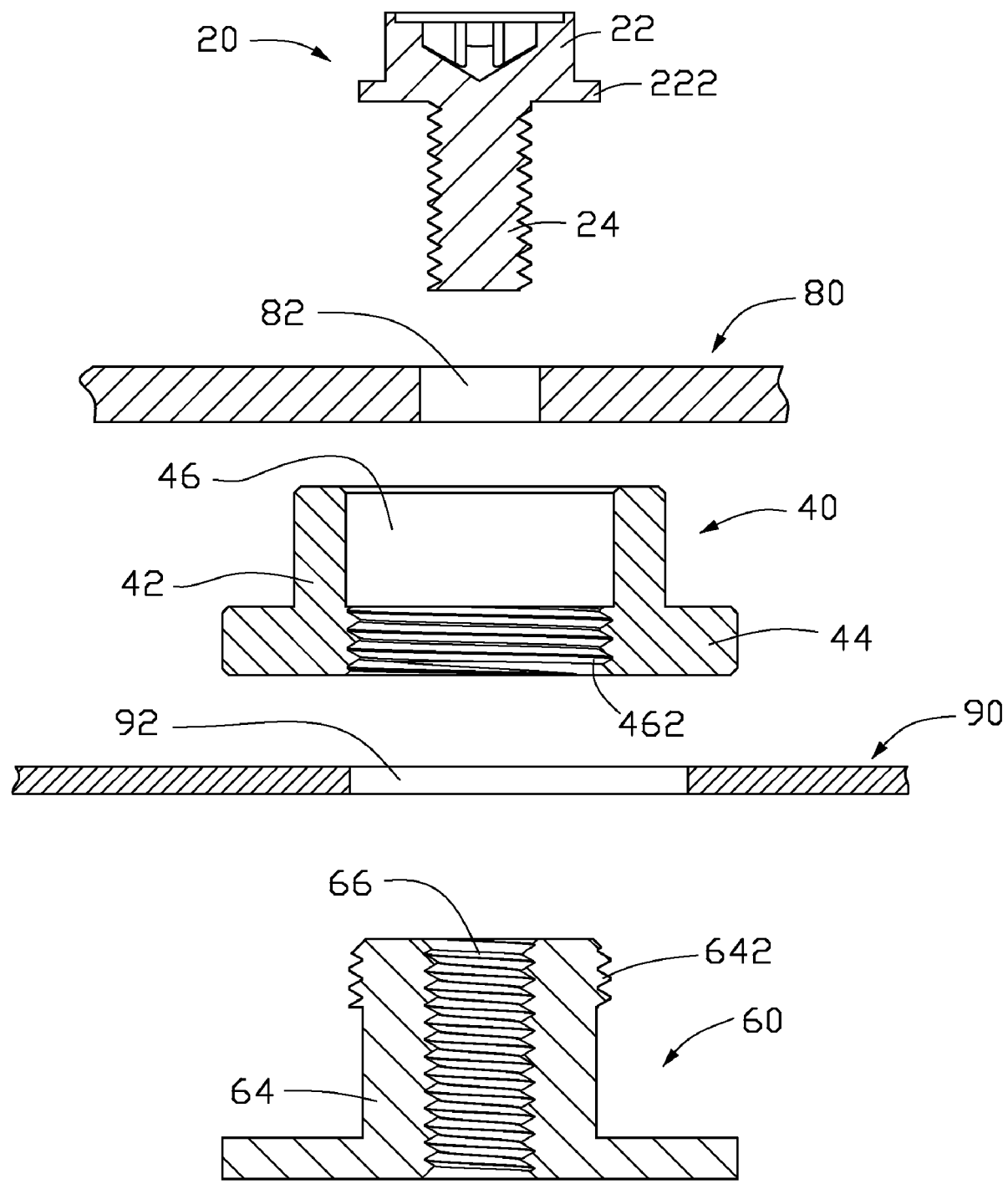
FIG. 2 is a cross-sectional view of FIG. 1.

Referring to FIGS. 1 and 2, in an embodiment, a fixing device includes a threaded fastener (such as a screw 20), a spacer 40, and a nut member 60.

The screw 20 includes a head 22 and a threaded rod 24 perpendicularly extending from the head 22. An annular shoulder 222 is circularly formed around the head 22 adjacent the threaded rod 24. The outer diameter of the shoulder 222 is greater than that of the threaded rod 24.

The spacer 40 has an inverted T-shape in profile. The spacer 40 includes a supporting post 42 and an annular stopping portion 44 formed at an end of the supporting post 42. The outer diameter of the supporting post 42 is greater than that of the stopping portion 44. A coupling hole 46 is defined through the spacer 40 at the center thereof. A female thread 462 is formed on a part of the interior surface of the coupling hole 46 at an end thereof that corresponds to the stopping portion 44.

The nut member 60 includes a round pressing portion 62 and a round coupling portion 64 extending from the coupling portion 62. The outer diameter of the pressing portion 62 is generally equal to that of the stopping portion 44. A male thread 642 is formed on a part of the exterior surface of the coupling portion 64 at a free end thereof, corresponding to the female thread 462 of the coupling hole 46 of the spacer 40. The outer diameter of the coupling portion 64 is smaller than the inner diameter of the coupling hole 46 of the spacer 40. A threaded hole 66 is defined through the nut member 60 at the center thereof, for receiving the threaded rod 24 of the screw 20.

Generally, a plurality of fixing devices is used to secure a circuit board such as a motherboard 80 to a plate member 90 of a computer chassis. In the embodiment, one fixing device is exemplarily shown in the drawings. An aligning hole 82 is defined through the motherboard 80 to allow the threaded rod 24 of the screw 20 inserting therethrough. The inner diameter of the aligning hole 82 is smaller than the outer diameters of the supporting post 42 of the spacer 40 and the annular shoulder 222 of the screw 20. An inserting hole 92 is defined through the plate member 90 corresponding to the aligning hole 82 of the motherboard 80. The inner diameter of the inserting hole 92 is greater than the outer diameter of the coupling portion 64 of the nut member 60, but smaller than the outer diameter of the pressing portion 62 thereof.

Figure 3:
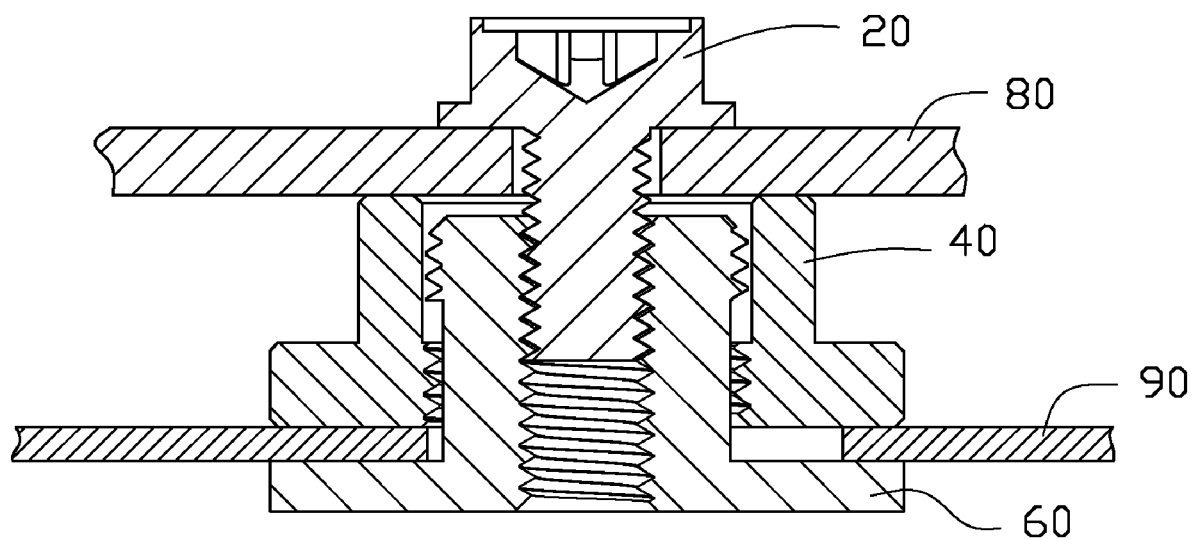
FIG. 3 is an assembled view of FIG. 2.

Referring to FIGS. 1-3, in assembly, the coupling portion 64 of the nut member 60 is inserted through the inserting hole 92 of the plate member 90 from a bottom surface thereof and extends out of a top surface thereof. The coupling portion 64 is movably retained in the coupling hole 46 of the spacer 40, which is disposed on the top surface of the plate member 90, after the free end of the coupling portion 64 is threadedly passed through the end of the coupling hole 46. The male thread 642 of the coupling portion 64 abuts on the female thread 462 of the coupling hole 46 to prevent the coupling portion 64 from freely disengaging from the coupling hole 46. Thus the plate member 90 is sandwiched between the stopping portion 44 of the spacer 40 and the pressing portion 62 of the nut member 60, but the spacer 40 and the nut member 60 are together movable in the inserting hole 92 relative to the plate member 90. When the motherboard 80 is put on the spacer 40, the combined spacer 40 and nut member 60 is adjustable in the inserting hole 92 to thereby allow the aligning hole 82 of the motherboard 80 aligning with the threaded hole 66 of the nut member 60. The threaded rod 24 of the screw 20 is inserted through the aligning hole 82 of the motherboard 80 and screwed in the threaded hole 66 of the nut member 60. The coupling portion 64 is moved to allow the pressing portion 62 to be adjacent the spacer 40, thereby the threaded part of the exterior surface of the coupling portion 64 is spaced from the threaded part of the interior surface of the coupling hole 46 a certain distance. Thus the annular shoulder 222 of the head 22 presses the motherboard 80 to tightly abut on the supporting post 42 of the spacer 40, and the plate member 90 is firmly sandwiched between the stopping portion 44 and the pressing portion 62. There is also a space left between the motherboard 80 and the plate member 90 by supporting of the spacer 40. And the height of the remaining unthreaded part of the exterior surface of the coupling portion 64 is greater than the height of the threaded part of the interior surface of the coupling hole 46, while the height of the remaining unthreaded part of the interior surface of the coupling hole 46 is greater than the height of the threaded part of the exterior surface of the coupling portion 64.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fixing device for securing a circuit board to a plate member, comprising:
    a spacer being located between the circuit board and the plate member and defining a coupling hole therethrough, a female thread being formed on a part of an interior surface of the coupling hole at an end thereof;
    a nut member comprising a pressing portion and a coupling portion extending from the pressing portion, a male thread being formed on a part of an exterior surface of the coupling portion at a free end thereof, corresponding to the female thread of the coupling hole of the spacer, a threaded hole being defined in the nut member, the coupling portion movably retained in the coupling hole of the spacer after the free end of the coupling portion with the male thread being screwed through the end of the coupling hole with the female thread, the pressing portion and the spacer cooperatively configured for sandwiching the plate member therebetween; and
    a fastener including a head and a threaded rod extending from the head for being screwed in the threaded hole of the nut member, the head being sandwiched the circuit board with the spacer;
    wherein the height of the remaining unthreaded part of the exterior surface of the coupling portion is greater than the height of the threaded part of the interior surface of the coupling hole, so that the coupling portion can be moved to allow the pressing portion to be adjacent the spacer as the threaded rod of the fastener is screwed into the threaded hole of the nut member.

2. The fixing device as described in claim 1, wherein the spacer takes an inverted "T" in profile, and when the coupling portion of the nut member is retained in the coupling hole of the spacer and the threaded rod of the fastener is engaged in the threaded hole of the nut member, a smaller end of the spacer is adjacent the head of the fastener and a bigger end thereof is adjacent the pressing portion of the nut member.

3. The fixing device as described in claim 1, wherein the spacer comprises a supporting post and a stopping portion formed at an end of the supporting post, and when the coupling portion of the nut member is retained in the coupling hole of the spacer and the threaded rod of the fastener is engaged in the threaded hole of the nut member, the supporting post of the spacer is adjacent the head of the fastener and the stopping portion thereof is adjacent the pressing portion of the nut member.

4. The fixing device as described in claim 3, wherein an outer diameter of the stopping portion of the spacer is generally equal to an outer diameter of the pressing portion of the nut member.

5. The fixing device as described in claim 3, wherein an outer diameter of the stopping portion of the spacer is greater than an outer diameter of the supporting post of the spacer.

6. The fixing device as described in claim 1, wherein a shoulder is formed at a junction between the head of the fastener and the threaded rod of the fastener, configured to press the circuit board against the spacer.

7. The fixing device as described in claim 1, wherein the height of the remaining unthreaded part of the interior surface of the coupling hole is greater than the height of the threaded part of the exterior surface of the coupling portion.

8. A mounting assembly comprising:
    a plate member defining at least one inserting hole therein;
    a circuit board defining at least one aligning hole corresponding to said at least one inserting hole;
    a spacer being sandwiched between the plate member and the circuit board, the spacer comprising a supporting post supporting a portion of the circuit board surrounding said at least one aligning hole, and a stopping portion seated on a portion of the plate member surrounding said at least one inserting hole, a coupling hole being defined through the spacer, a female thread being formed on a part of an interior surface of the coupling hole at the stopping portion;
    a nut member comprising a pressing portion abutting against a surface of the plate member away from the circuit board, and a coupling portion extending from the pressing portion, a male thread being formed at a free end of the coupling portion, the coupling portion being passed through said at least one inserting hole of the plate member and screwed through the threaded part of the coupling hole of the spacer and retained in the coupling hole of the spacer, a threaded hole being defined in the nut member; and
    a fastener including a head abutting against a surface of the circuit board away from the plate member, and a threaded rod extending from the head and being inserted through said at least one aligning hole of the circuit board and screwed in the threaded hole of the nut member, thereby firmly securing the circuit board to a plate member;
    wherein as the threaded rod of the fastener is screwed into the threaded hole of the nut member, the coupling portion is urged to move within the coupling hole to allow the pressing portion to be adjacent the spacer, thereby the threaded part of the exterior surface of the coupling portion is spaced from the threaded part of the interior surface of the coupling hole.

9. The mounting assembly as described in claim 8, wherein an inner diameter of the inserting hole of the plate member is greater than an outer diameter of the coupling portion of the nut member and smaller than outer diameters of the pressing portion of the nut member and the stopping portion of the spacer.

10. The mounting assembly as described in claim 9, wherein an outer diameter of the supporting post of the spacer is greater than an inner diameter of said at least aligning hole of the circuit board.

11. The mounting assembly as described in claim 10, wherein the outer diameter of the stopping portion of the spacer is greater than the out diameter the supporting post thereof.

12. The mounting assembly as described in claim 10, wherein the outer diameter of the stopping portion of the spacer is generally equal to the outer diameter of the pressing portion of the nut member.

13. The mounting assembly as described in claim 8, wherein an outer diameter of the coupling portion of the nut member is smaller than an inner diameter of the coupling hole of the spacer.

14. The mounting assembly as described in claim 8, wherein the height of the remaining unthreaded part of the exterior surface of the coupling portion is greater than the height of the threaded part of the interior surface of the coupling hole.

* * * * *